United States Patent
Mouli

(10) Patent No.: US 7,250,591 B2
(45) Date of Patent: Jul. 31, 2007

(54) PHOTONIC CRYSTAL-BASED FILTER FOR USE IN AN IMAGE SENSOR

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 10/856,940

(22) Filed: Jun. 1, 2004

(65) Prior Publication Data

US 2005/0263675 A1    Dec. 1, 2005

(51) Int. Cl.
H01L 27/00     (2006.01)
H01L 31/00     (2006.01)
H01L 31/0232   (2006.01)
H04N 3/14      (2006.01)

(52) U.S. Cl. .............. 250/208.1; 250/214.1; 257/432; 348/272

(58) Field of Classification Search .......... 250/208.1, 250/214.1, 226; 257/432, 435, 437, 443, 257/2; 348/272, 340; 359/322, 237; 343/786, 343/787

See application file for complete search history.

(56) References Cited

U.S. PATENT DOCUMENTS

| | | | |
|---|---|---|---|
| 5,990,506 A * | 11/1999 | Fossum et al. | 257/294 |
| 5,999,308 A | 12/1999 | Nelson et al. | |
| 6,093,246 A | 7/2000 | Lin et al. | |
| 6,366,392 B1 * | 4/2002 | Tokushima | 359/321 |
| 6,768,256 B1 | 7/2004 | Fleming et al. | |
| 6,856,737 B1 | 2/2005 | Parker et al. | |
| 2003/0063204 A1 * | 4/2003 | Suda | 348/272 |
| 2004/0041783 A1 * | 3/2004 | Lee et al. | 345/102 |
| 2004/0055528 A1 | 3/2004 | Miyazaki | |
| 2005/0128592 A1 | 6/2005 | Nishii et al. | |

OTHER PUBLICATIONS

R. Biswas et al.—"Photonic band gaps of porous solids," The American Physical Society, Physical Review B, vol. 61, No. 7, Articles, Feb. 15, 2000, pp. 4549-4553.

M. J. Cryan et al.—"Design and Simulation of a Photonic Crystal Waveguide Filter Using the FDTD Method," IEEE, 2002 pp. 669-670.

H. Han et al.—"Terahertz pulse propagation in a plastic photonic crystal fiber," American Institute of Physics, Applies Physics Letters, vol. 80, No. 15, Apr. 15, 2002, pp. 2634-2636.

Pantanjali V. Parimi et al.—"Imaging by a Flat Lens due to Negative Refraction," Nature Publishing Group, vol. 426, Nov. 2003, pp. 1-4 and p. 404.

(Continued)

Primary Examiner—Georgia Epps
Assistant Examiner—Don Williams
(74) Attorney, Agent, or Firm—Dickstein Shapiro LLP

(57) ABSTRACT

The invention, in various exemplary embodiments, incorporates a photonic crystal filter into an image sensor. The photonic crystal filter comprises a substrate and a plurality of pillars forming a photonic crystal structure over the substrate. The pillars are spaced apart from each other. Each pillar has a height and a horizontal cross sectional shape. A material with a different dielectric constant than the pillars is provided within the spacing between the pillars. The photonic crystal filter is configured to selectively permit particular wavelengths of electromagnetic radiation to pass through.

21 Claims, 11 Drawing Sheets

OTHER PUBLICATIONS

J. B. Pendry—"Negative Refraction Makes a Perfect Lens," The American Physical Society, Physical Review Letters, vol. 85, No. 18, Oct. 30, 2000, pp. 3966-3969.

E. Rave et al.—"Infrared photonic crystal fiber," American Institute of Physics, Applied Physics Letters, vol. 83, No. 10, Sep. 8, 2003, pp. 1912-1914.

K. Matsuda et al.—"Tunable single-photon source using Korteweg-de Vries solitons," American Institute of Physics, Applied Physics Letters, vol. 81, No. 15, Oct. 7, 2002, pp. 2698-2700.

A. C. Stevenson et al.—"Detection of acoustic solitary waves in nonlinear lithium niobate crystals," American Institute of Physics, Applied Physics Letters, vol. 82, No. 16, Apr. 21, 2003, pp. 2733-2735.

* cited by examiner

PHOTONIC CRYSTAL-BASED FILTER FOR USE IN AN IMAGE SENSOR

FIELD OF THE INVENTION

The present invention relates generally to the field of semiconductor devices and more particularly to filters utilized in image sensor devices or displays.

BACKGROUND OF THE INVENTION

The semiconductor industry currently uses different types of semiconductor-based image sensors that use micro-lenses, such as charge coupled devices (CCDs), CMOS active pixel sensors (APS), photodiode arrays, charge injection devices and hybrid focal plane arrays, among others. These image sensors use micro-lenses to focus electromagnetic radiation onto the photo-conversion device, e.g., a photodiode. Also, these image sensors can use filters to select particular wavelengths of electromagnetic radiation for sensing by the photo-conversion device.

Micro-lenses of an image sensor help increase optical efficiency and reduce cross talk between pixel cells. FIG. 1A shows a portion of a CMOS image sensor pixel cell array 100. The array 100 includes pixel cells 10, each being formed on a substrate 1. Each pixel cell 10 includes a photo-conversion device 12, for example, a photodiode. The illustrated array 100 has micro-lenses 20 that collect and focus light on the photo-conversion devices 12. The array 100 can also include a light shield, e.g., a metal layer 7, to block light intended for one photo-conversion device from reaching other photo-conversion devices of the pixel cells 10.

The array 100 can also include a color filter array 30. The color filter array includes color filters 31a, 31b, 31c, each disposed over a pixel cell 10. Each of the filters 31a, 31b, 31c allows only particular wavelengths of light to pass through to a respective photo-conversion device. Typically, the color filter array 30 is arranged in a repeating Bayer pattern and includes two green color filters 31a, a red color filter 31b, and a blue color filter 31c, arranged as shown in FIG. 1B.

Between the color filter array 30 and the pixel cells 10 is an interlayer dielectric (ILD) region 3. The ILD region 3 typically includes multiple layers of interlayer dielectrics and conductors that form connections between devices of the pixel cells 10 and from the pixel cells 10 to circuitry (not shown) peripheral to the array 100. Between the color filter array 30 and the micro-lenses 20 is a dielectric layer 5.

Typical color filters 31a, 31b, 31c can be fabricated using a number of conventional materials and techniques. For example, color filters 31a, 31b, 31c can be a gelatin or other appropriate material dyed to the respective color. Also, polyimide filters comprising thermally stable dyes combined with polyimides have been incorporated into photolithography processes. Although color filters prepared using photolithography can exhibit good resolution and color quality, photolithography can be complicated and results in a high number of defective filters 31a, 31b, 31c. Specifically, using photolithography to form the color filter array 30 including polyimide filters 31a, 31b, 31c requires a mask, a photoresist, a baking step, an etch step, and a resist removal step for each color. Thus, to form color filter array 30 arranged in a Bayer pattern, this process must be repeated three times.

It would, therefore, be advantageous to have alternative filters for use in an image sensor to provide a greater variety of engineering and design opportunities.

BRIEF SUMMARY OF THE INVENTION

The invention, in various exemplary embodiments, incorporates a photonic crystal filter into an image sensor. The photonic crystal filter comprises a substrate and a plurality of pillars forming a photonic crystal structure over the substrate. The pillars are spaced apart from each other. Each pillar has a height and a horizontal cross sectional shape. A material with a different dielectric constant than the pillars is provided within the spacing between the pillars. The photonic crystal filter is configured to selectively permit particular wavelengths of electromagnetic radiation to pass through.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1A:
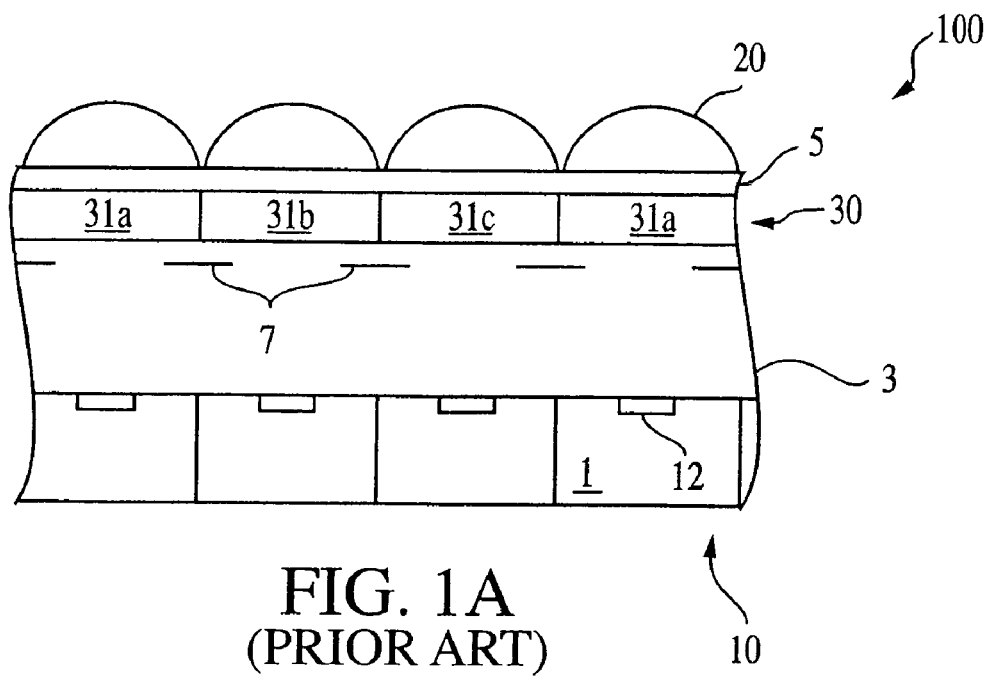
FIG. 1A is a cross sectional view of a portion of a conventional image sensor array.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-onsapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

The term "photonic crystal" refers to a material and/or lattice of structures (e.g. an arrangement of pillars) with a periodic alteration in the index of refraction. A "photonic crystal element" is an element that comprises a photonic crystal structure.

Embodiments of the invention provide a photonic crystal element and an image sensor employing a photonic crystal filter. The photonic crystal filter can replace a conventional filter, and can be used, for example, as a color filter array.

Photonic crystals have recently been recognized for their photonic band gaps. A photonic crystal interacts with electromagnetic waves analogously to how a semiconductor crystal interacts with charge particles or their wave forms, i.e., photonic crystal structures are optical analogs of semiconductor crystal structures. The fundamental aspect of both photonic and semiconductor crystals is their periodicity. In a semiconductor, the periodic crystal structure of atoms in a lattice is one of the primary reasons for its observed properties. For example, the periodicity of the structure allows quantization of energy (E) levels and wave vector momentum (k) levels (band structure, E-k relationships). In a similar manner, photonic crystals have structures that allow the tailoring of unique properties for electromagnetic wave propagation. Similar to band gap energy in semiconductors, where carrier energies are forbidden, photonic crystals can provide a photonic band gap for electromagnetic waves, where the presence of particular wavelengths is forbidden. See Biswas, R. et al., *Physical Review B, vol.* 61, no. 7, pp. 4549–4553 (1999), the entirety of which is incorporated herein by reference.

Unlike semiconductors, photonic crystals are not limited to naturally occurring materials and can be synthesized easily. Therefore, photonic crystals can be made in a wide range of structures to accommodate the wide range of frequencies and wavelengths of electromagnetic radiation. Electromagnetic waves satisfy the simple relationship to the velocity of light:

$$c = n\lambda$$

where c=velocity of light in the medium of interest, n=frequency and λ=wavelength. Radio waves are in the 1 millimeter (mm) range of wavelengths whereas extreme ultraviolet rays are in the 1 nanometer (nm) range. While band structure engineering in semiconductors is very complex, photonic band structure engineering in photonic crystals it is relatively simple. Photonic crystals can be engineered to have a photonic band structure that blocks particular wavelengths of light while allowing other wavelengths to pass through.

Figure 2A:
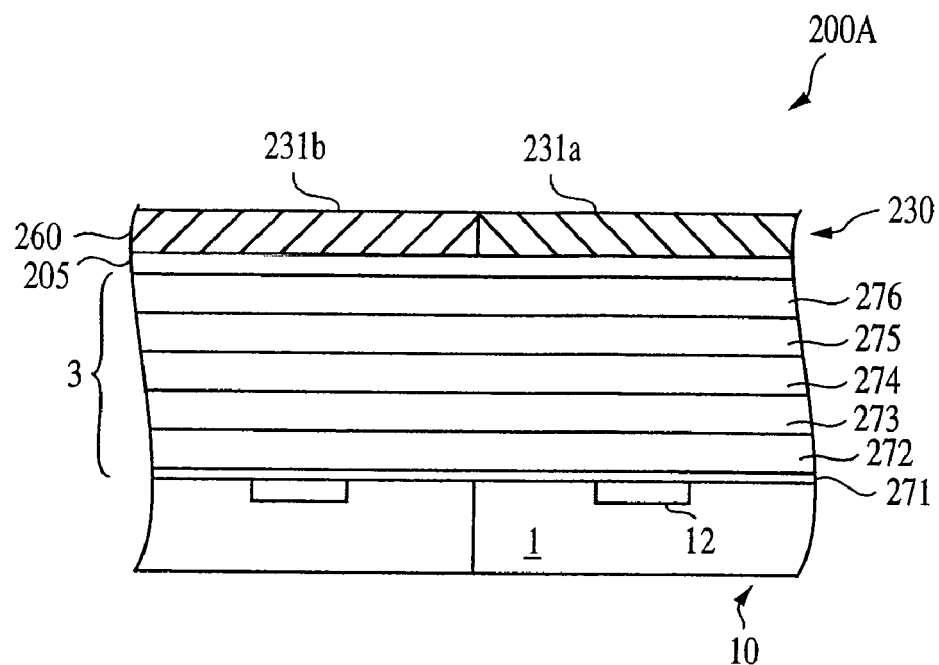
FIG. 2A is a cross sectional view of a portion of an image sensor array including photonic crystal filters according to an exemplary embodiment of the invention.
Figure 5:
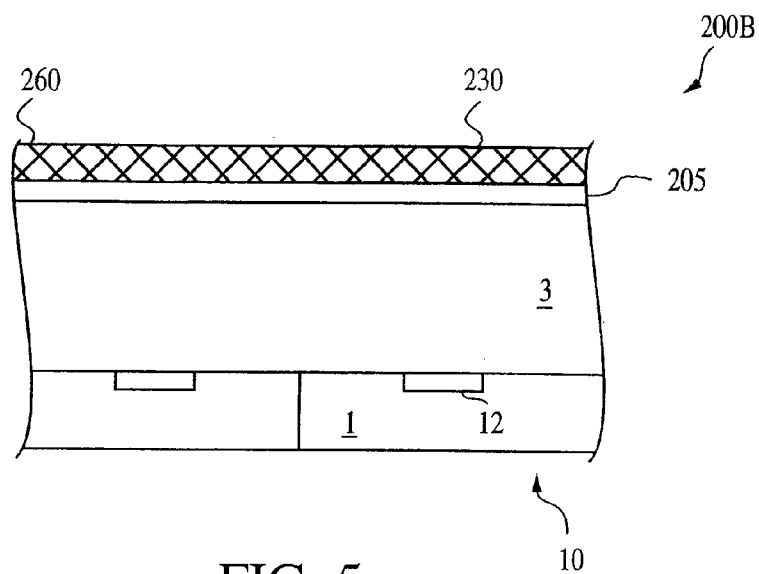
FIG. 5 is a cross sectional view of a portion of an image sensor array including a photonic crystal filter according to another exemplary embodiment of the invention.

Referring to the figures, FIGS. 2A, 5, and 6 illustrate a portion of image sensor arrays 200A–C, respectively, each including a photonic crystal filter 230 according to exemplary embodiments of the invention. In each of the exemplary embodiments depicted in FIGS. 2A, 5 and 6, the illustrated arrays 200A–C include at least one filter 230 having a photonic crystal structure. The photonic band structure of the filter 230 can be engineered to achieve the desired properties for the filter 230 (e.g., wavelength selectivity) as described in more detail below. For illustrative purposes, image sensor pixel cell arrays 200A–C are CMOS image sensor arrays including CMOS pixel cells 10. It should be readily understood that embodiments of the invention also include CCD and other image sensors.

In the exemplary embodiments of FIGS. 2A, 5 and 6, the arrays 200A–C are partially similar to the array 100 depicted in FIG. 1A. Thus, each array 200A–C includes pixel cells 10 having photo-conversion devices 12, and an ILD region 3. Instead of a conventional color filter array 30, however, each array 200A–C includes at least one photonic crystal filter 230 over at least a portion of the pixel cells 10. The filter 230 is formed on a base layer 205 as a layer 260, which includes a photonic crystal structure. Preferably, layer 260 is approximately flat. The photonic crystal structure of layer 260 can be varied to achieve desired filter 230 characteristics, e.g., a desired photonic band structure to prevent particular wavelengths of light from passing through the filter 230.

The ILD region 3 can have the exemplary structure shown in FIG. 2A. A layer 271 of tetraethyl orthosilicate (TEOS) is over the substrate 1 and the devices formed thereon, including the photo-conversion devices 12 and, e.g., transistors (not shown) of the pixel cells 10. Over the TEOS layer 271, there is a layer 272 of borophosphosilicate glass (BPSG) followed by first, second, and third interlayer dielectric layers 273, 274, 275, respectively. A passivation layer 276 is over the third interlayer dielectric layer 275. There are also conductive structures, e.g., metal lines, forming connections between devices of the pixel cells 10 and from the pixel cell 10 devices to external devices (not shown).

Figure 2B:
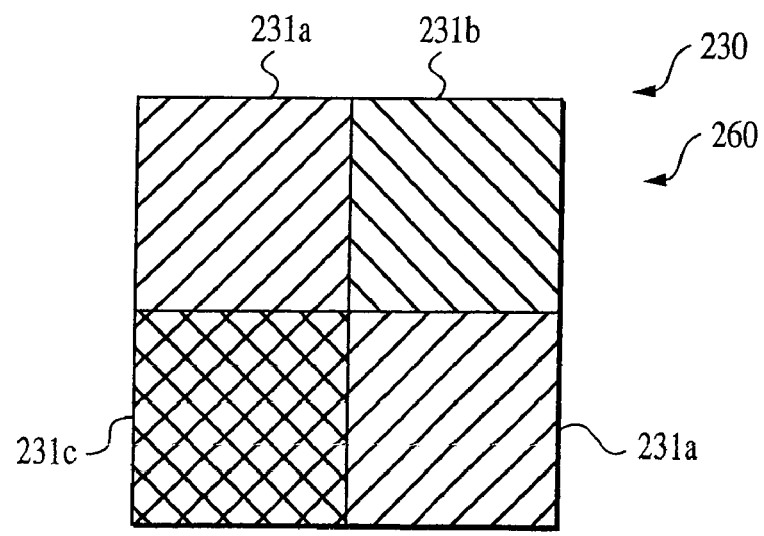
FIG. 2B is a top plan view of a portion of the image sensor array of FIG. 2A.

FIGS. 2A and 2B depict a pixel cell array 200A including a layer 260 having a photonic crystal structure. Layer 260 serves as a photonic crystal filter 230. In the embodiment of FIGS. 2A and 2B, layer 260 is patterned such that the photonic crystal filter 230 is configured in a Bayer pattern. As shown in the top plan view of FIG. 2B, layer 260 (or the filter 230) includes portions 231a, 231b, and 231c, which serve as green, red, and blue color filters, respectively. Each of the portions 231a, 231b, 231c have a different photonic crystal structure such that the particular wavelengths of light corresponding to the respective colors are permitted to pass through respective portions 231a, 231b, 231c to reach the respective underlying photo-conversion devices 12, while other wavelengths are blocked. In this manner, the filter 230 can replace a conventional color filter array 30 (FIG. 1A).

FIGS. 3A–3E depict steps for forming the array 200A of FIGS. 2A and 2B. No particular order is required for any of the actions described herein, except for those logically requiring the results of prior actions. Accordingly, while the actions below are described as being performed in a general order, the order is exemplary only and can be altered.

Figure 3A:
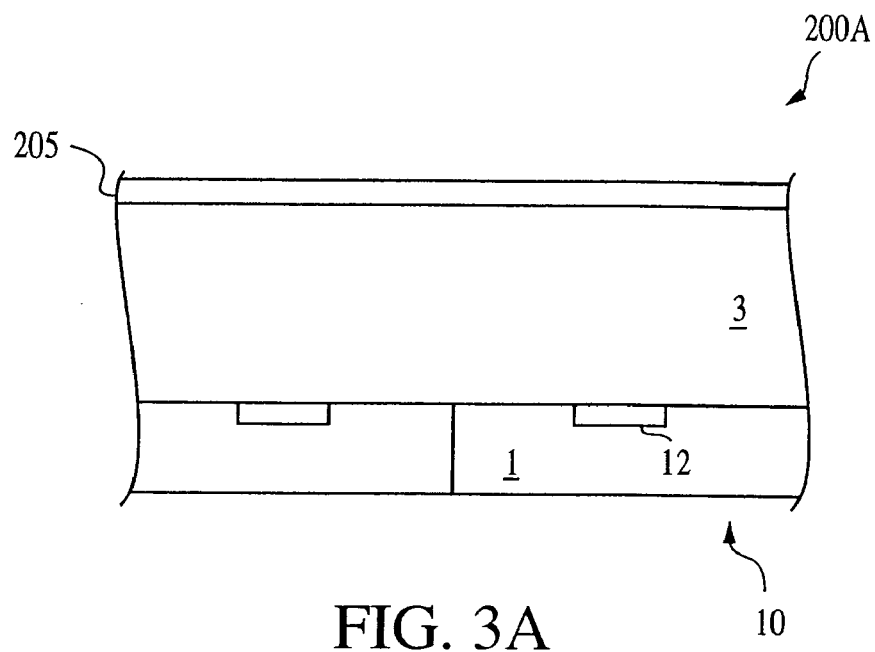
FIGS. 3A–3E illustrate intermediate stages of fabrication of the image sensor array of FIGS. 2A–2B according to another exemplary embodiment of the invention.

Referring to FIG. 3A, the photo-conversion devices 12; and an ILD region 3, including multiple interlevel dielectric layers, metal lines, contacts, and connections (not shown) are initially formed by any method as is known in the art. As shown in FIG. 3A, a base layer 205 is formed over the ILD region 3. The base layer 205 can be any suitable material that provides an approximately flat surface on which the photonic crystal structure of filter 230 can be formed. For example, the base layer 205 can be a dielectric layer (e.g., a layer of $SiO_2$) and can have a thickness within the range of approximately 50 Å to approximately 200 Å.

Figure 3B:
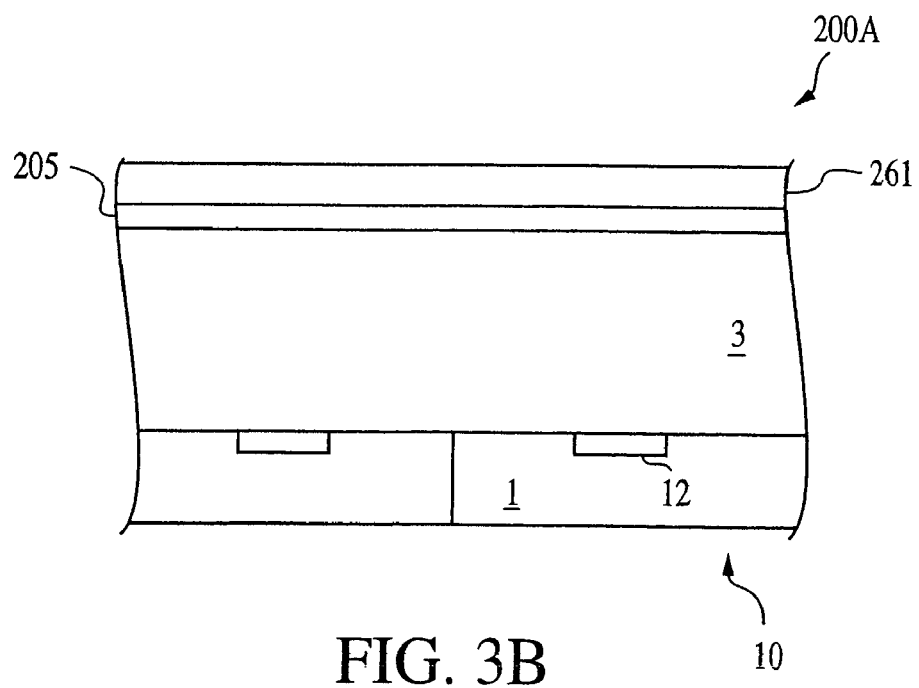

As shown in FIG. 3B, a layer 261 of material suitable for forming a photonic crystal is formed over the base layer 205. Examples of such materials include aluminum oxide ($Al_2O_3$), tantalum oxide ($Ta_2O_3$), zirconium oxide ($ZrO_2$), hafnium oxide ($HfO_2$), and hafnium-based silicates, among others. It should be noted that certain materials can yield a photonic crystal that absorbs a portion of the photons. If the absorption is excessive, quantum efficiency can be detrimentally affected. Preferably, layer 261 is a layer of $Al_2O_3$ since it offers less absorption and is similar to $SiO_2$ in its barrier properties. The thickness of layer 261 can be chosen as needed or desired. Preferably, layer 261 is formed having a thickness within the range of approximately 100 Å to approximately 5000 Å.

Figure 3C:
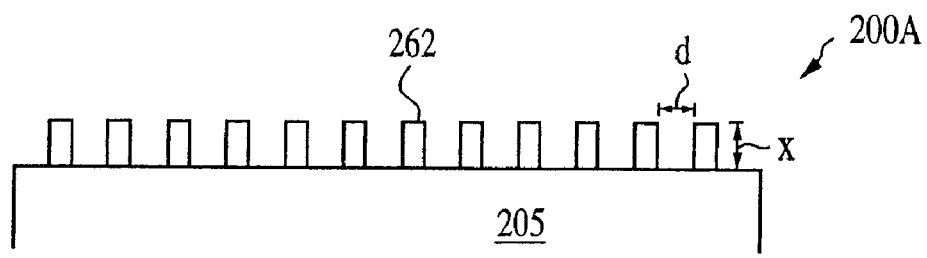

Using a mask level, the $Al_2O_3$ layer 261 is patterned and etched to create photonic crystal structure pillars 262, as depicted in FIG. 3C. Referring to FIG. 3C, the ratio x/d of spacing x between the pillars 262 to the thickness d of layer 261 (or height of the pillars 262) can be varied to achieve desired characteristics of the photonic crystal, and thus, the filter 230. Illustratively, x/d is within the range of approximately 1 to approximately 10. Spacer-defined lithography can also be used, particularly if patterning the pillars 262 to achieve a desired ratio x/d is a challenge with existing lithography techniques.

Figure 4A:
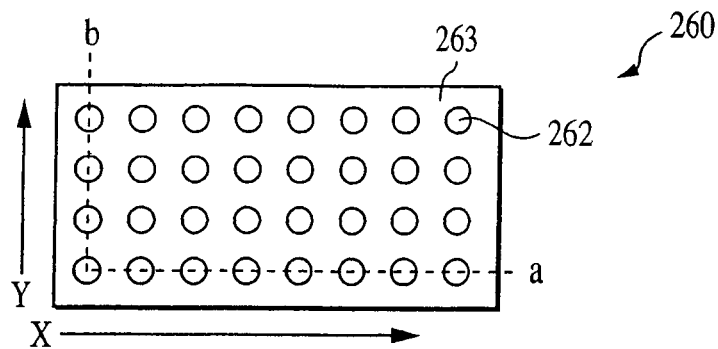
FIGS. 4A–4D are top down views of photonic crystal structures according to exemplary embodiments of the invention.
Figure 4B:
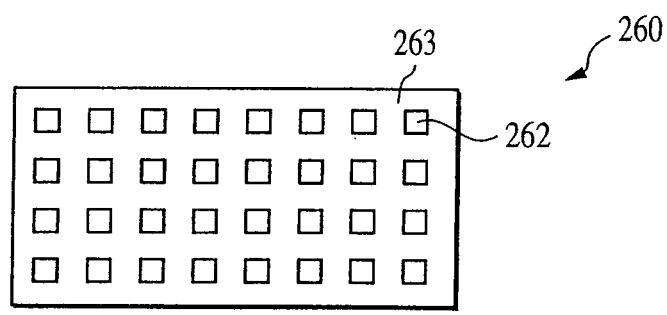
Figure 4C:
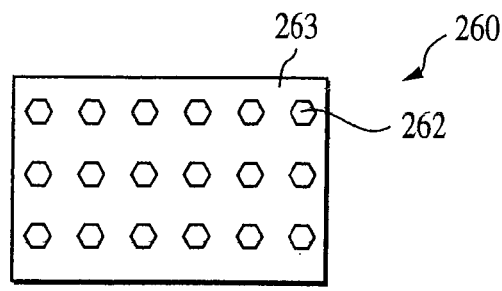

The pillars 262 can be formed having any desired horizontal cross-sectional shape. FIGS. 4A–4C depict exemplary pillar 262 shapes. FIG. 4A is a top plan view of layer 260 with pillars 262 having a circular horizontal cross-sectional shape (i.e., the pillars 262 are cylinders). FIGS. 4B and 4C depict layer 260 including pillars having rectangular and pentagonal horizontal cross-sectional shapes, respectively.

Figure 4D:
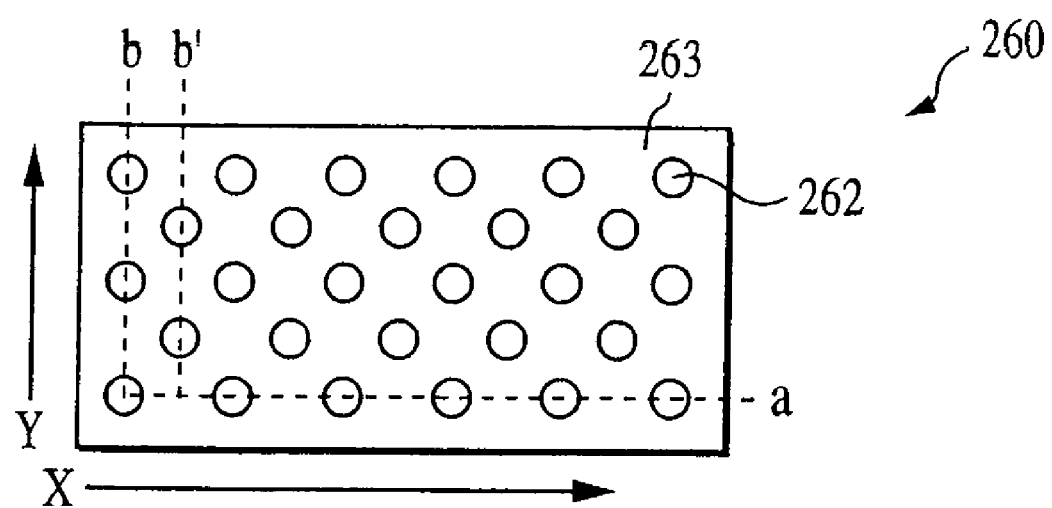

Also, the pillars 262 can be arranged in a variety of orientations. As shown in FIG. 4A, the pillars 262 are arranged in columns B in the Y direction and rows A in the X direction, such that a pillar 262 from each consecutive row A forms a column B in the Y direction. Alternatively, as shown in FIG. 4D, the pillars 262 can be arranged in rows along line A in the X direction with each row along line A being offset from an adjacent row A, such that pillars 262 from every other row A form a column B and B', respectively, in the Y direction.

Each thickness d, spacing x, x/d ratio, horizontal cross sectional shape of the pillars 262, orientation of the pillars 262, and the material of the pillars 262 and layer 263 are design variables. These design variables can be chosen to achieve a desired photonic crystal structure and, therefore, the desired properties of layer 260.

Figure 3D:
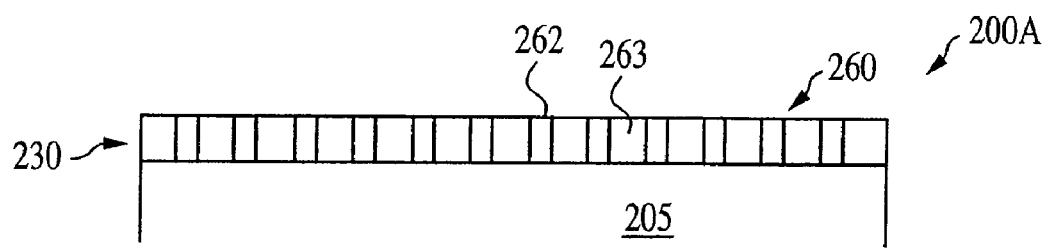

A low dielectric constant layer 263 is deposited between the pillars 262 and planarized using a CMP step, as illustrated in FIG. 3D. Layer 263 can be formed of any suitable material having a low dielectric constant, for example, SOG or $SiO_2$, among others. The layer 263 can be formed by any suitable technique. For simplicity, pillars 262 and layer 263 are depicted collectively as layer 260.

Any of the design variables (thickness d of layer 261, the spacing x between the pillars 262, the ratio x/d, the horizontal cross sectional shape of the pillars 262, the orientation of the pillars 262, and materials of pillars 262 and layer 263) can be varied to achieve a desired photonic crystal structure and, therefore, the desired properties of layer 260 and the filter 230. To achieve the array 200A shown in FIGS. 2A and 2B, layer 260 is patterned and etched such that any one or more of the design variables are different in one or more portions of layer 260. That is, the photonic crystal structure of layer 260 is different between portions of layer 260.

Figure 3E:
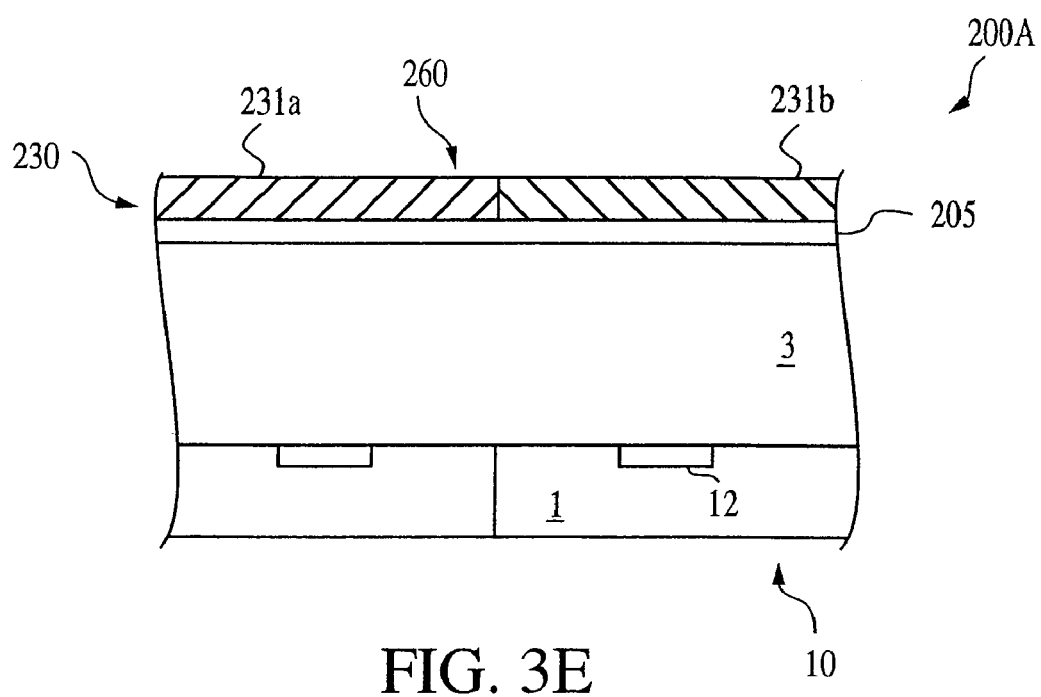

Referring to FIG. 3E, layer 260 is patterned and etched such that each portion 231a, 231b, 231c (FIG. 2B) of layer 260 has a different photonic crystal structure, each of which allows only particular wavelengths of light to pass through. The photonic crystal structures of the portions 231a, 231b, 231c are formed such that each portion 231a, 231b, 231c allows different wavelengths of light to pass through. In the embodiment of FIGS. 2A and 2B, portion 231a is formed such that only green wavelengths of light are permitted to pass through, portion 231b is formed such that only red wavelengths of light are permitted to pass through, and portion 231c is formed such that only blue wavelengths of light are permitted to pass through. In this manner, the photonic crystal filter 230 serves as a Bayer patterned color filter array.

To complete the array 200A additional processing steps may be performed. For example, a dielectric layer can be deposited over the filter 230 (or filter 230' where the array 200D includes the filter system 255). The thickness of this film can be in the range of approximately 500 Å to approximately 2000 Å. Also, additional conventional processing steps can be performed to form conventional micro-lenses 20.

FIG. 5 depicts another exemplary embodiment of a pixel array 200B with a photonic crystal filter 230 according to the invention. In the embodiment of FIG. 5, layer 260 has a uniform photonic crystal structure such that the filter 230 uniformly filters electromagnetic radiation across the array 200B. The photonic crystal structure of layer 260 can be engineered such that the filter 230 has the desired properties, e.g., selectivity for particular wavelengths of electromagnetic radiation. The array 200B can formed as described above in connection with FIGS. 3A–4F, except that layer 261 is patterned and etched by known techniques to create a uniform filter 230, as shown in FIG. 5.

Illustratively, the filter 230 of the embodiment of FIG. 5 is selective for infrared wavelengths of light. The pixel array 200B is particularly suitable for use in automobile applications.

Figure 6A:
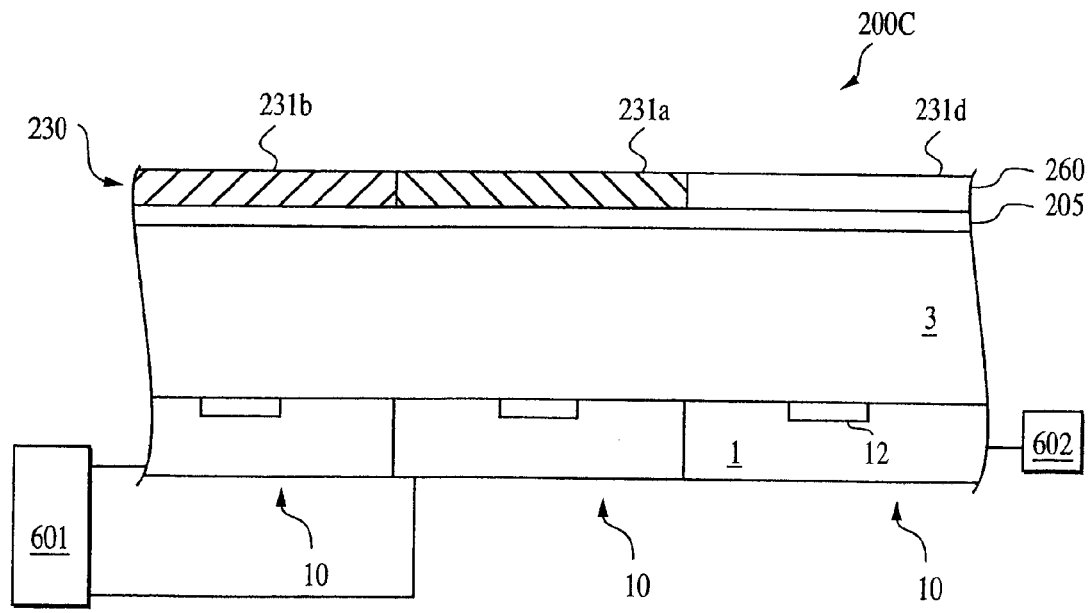
FIG. 6A is a cross sectional view of a portion of an image sensor array including photonic crystal filters according to another exemplary embodiment of the invention.
Figure 6B:
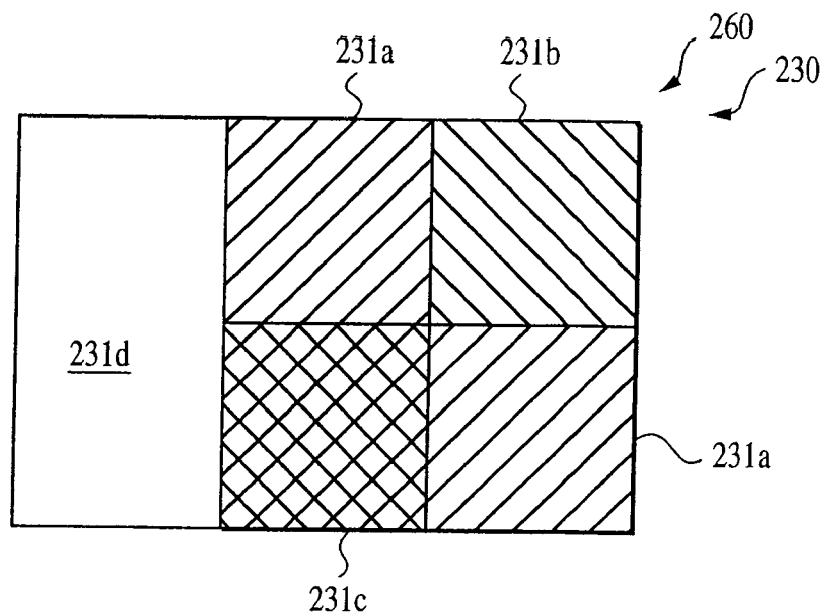
FIG. 6B is a top plan view of a portion of the image sensor array of FIG. 6A.

FIGS. 6A and 6B depict another exemplary embodiment of a pixel array 200C with a photonic crystal filter 230 according to the invention. As shown in the top plan view of FIG. 6B, the layer 260 includes portions 231a, 231b, and 231c. As described above in connection with FIGS. 2A and 2B, portion 231a is formed such that only green wavelengths of light are permitted to pass through, portion 231b is formed such that only red wavelengths of light are permitted to pass through, and portion 231c is formed such that only blue wavelengths of light are permitted to pass through. The layer 261 also includes portion 231d, which is formed such that only infrared wavelengths of light are permitted to pass through, as described above in connection with FIG. 5.

As shown in FIG. 6B, the portions 231a, 231b, and 231c are arranged in a Bayer-type pattern. The portion 231d is adjacent to the portions 231a, 231b, and 231c. The array 200C can be formed as described above in connection with FIGS. 3A–4F, except that layer 261 is patterned and etched to include the additional portion 231d.

Figure 1B:
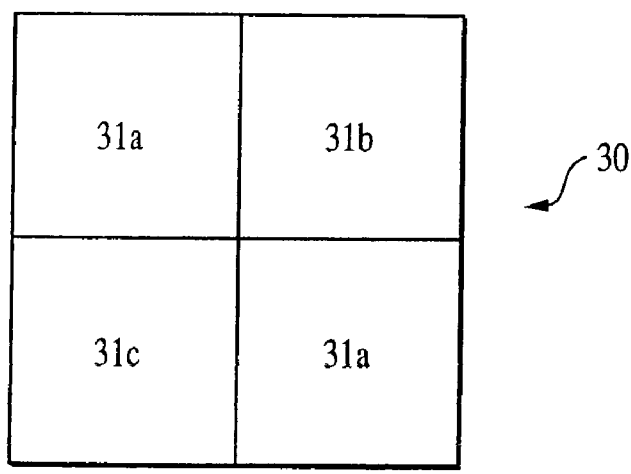
FIG. 1B is a block diagram of a portion of a conventional color filter array.

The array 200C can enable both color imaging and infrared imaging by a same image sensor. Preferably, as shown in FIG. 6A, a first circuit 601 is coupled to the pixel cells 10 corresponding to the portions 231a, 231b, and 231c, and a second circuit 602 is coupled to the pixel cells 10 corresponding to the portion 231d. The circuits 601, 602 are configured as is known in the art to produce images based on the output of the respective pixel cells 10. An array with both color filters and infrared filters is difficult to achieve using conventional color filter array 30 (FIG. 1) polymer films.

Figure 7:
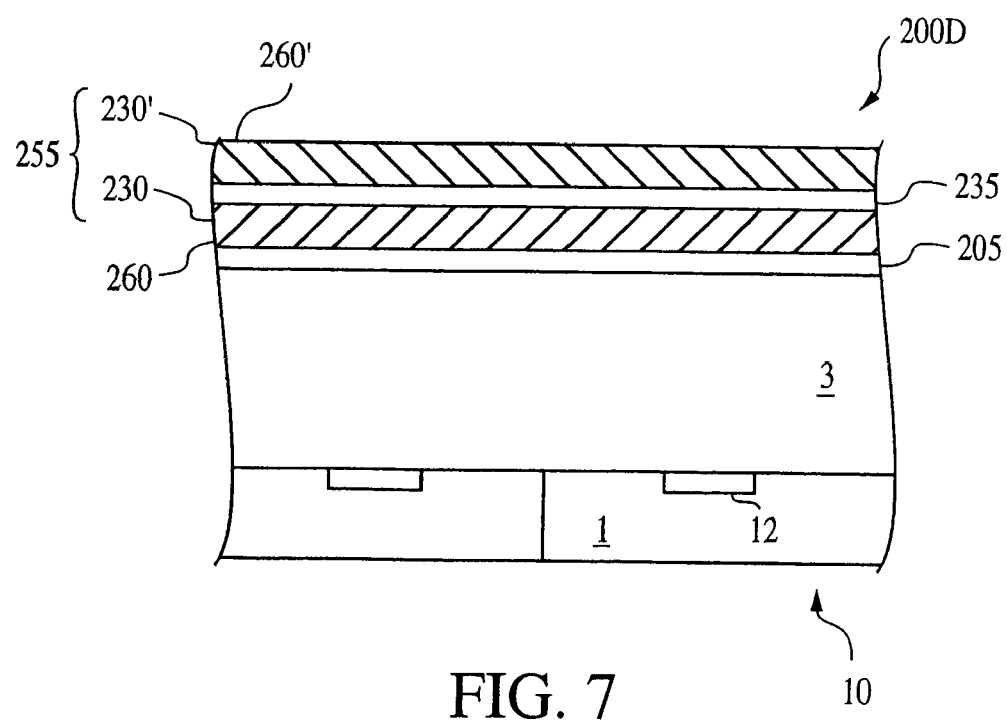
FIG. 7 is a cross sectional view of a portion of an image sensor array including photonic crystal filters according to another exemplary embodiment of the invention.

FIG. 7 depicts another exemplary embodiment of a pixel array 200D with a photonic crystal multilayer filter system 255 according to the invention. The filter system 255 includes at least two layers 260, 260'. Illustratively, layers 260, 260' each have a different photonic crystal structure and are separated by a dielectric layer 235. As shown in FIG. 7, layers 260, 260' each have a uniform photonic crystal structure and form a uniform photonic crystal filter 230, 230', respectively. The photonic crystal structure of layer 260 is different than that of layer 260' so that filter 230 filters electromagnetic radiation differently than filter 230'.

Although the filter system 255 is shown including two uniform filters 230, 230', it should be readily understood that the system 255 can include more than two photonic crystal filters 230, 230' if desired. Also, one or more of filters 230, 230' can include any number of portions that filter electromagnetic radiation differently from each other.

The array 200D is formed having a filter system 255 including filters 230 and 230'. The array 200D can be formed in the same manner as the array 200B (FIG. 5), but with additional processing steps. A dielectric layer 235 (e.g., a layer of $SiO_2$) is formed over layer 260 by techniques known in the art. The dielectric layer 235 is illustratively formed having a thickness within the range of approximately 50 Å to approximately 200 Å. A second photonic crystal layer 560' having a photonic crystal structure is formed over the dielectric layer 235 in the same manner as described above in connection with FIGS. 3A–4D. Accordingly, layer 260' includes pillars 262 and low dielectric constant layer 263.

In the exemplary embodiment of FIG. 7, layer 260' is formed having a uniform photonic crystal structure and serves as a second uniform filter 230' over the first uniform filter 230. The photonic crystal structure of the second filter 230' can be different than the photonic crystal structure of the first filter 230. That is, one or more of the design variables (e.g., thickness d of layer 261, the spacing x between the pillars 262, the ratio x/d, the horizontal cross sectional shape of the pillars 262, the orientation of the pillars 262, and the material of pillars 262 and layer 263) of the second photonic crystal layer 260' of the second filter 230' is different than that of the first photonic crystal layer 260 of first filter 230.

Although the filter system 255 of FIG. 7 is shown including two uniform filters 230, 230', it should be readily understood that the system 255 can include more than two filters. Also, one or more of the filters 230, 230' can include portions configured having different photonic crystal structures, e.g., portions 231a, 231b, 231c, as in the embodiment of FIGS. 2A and 2B.

Figure 8:
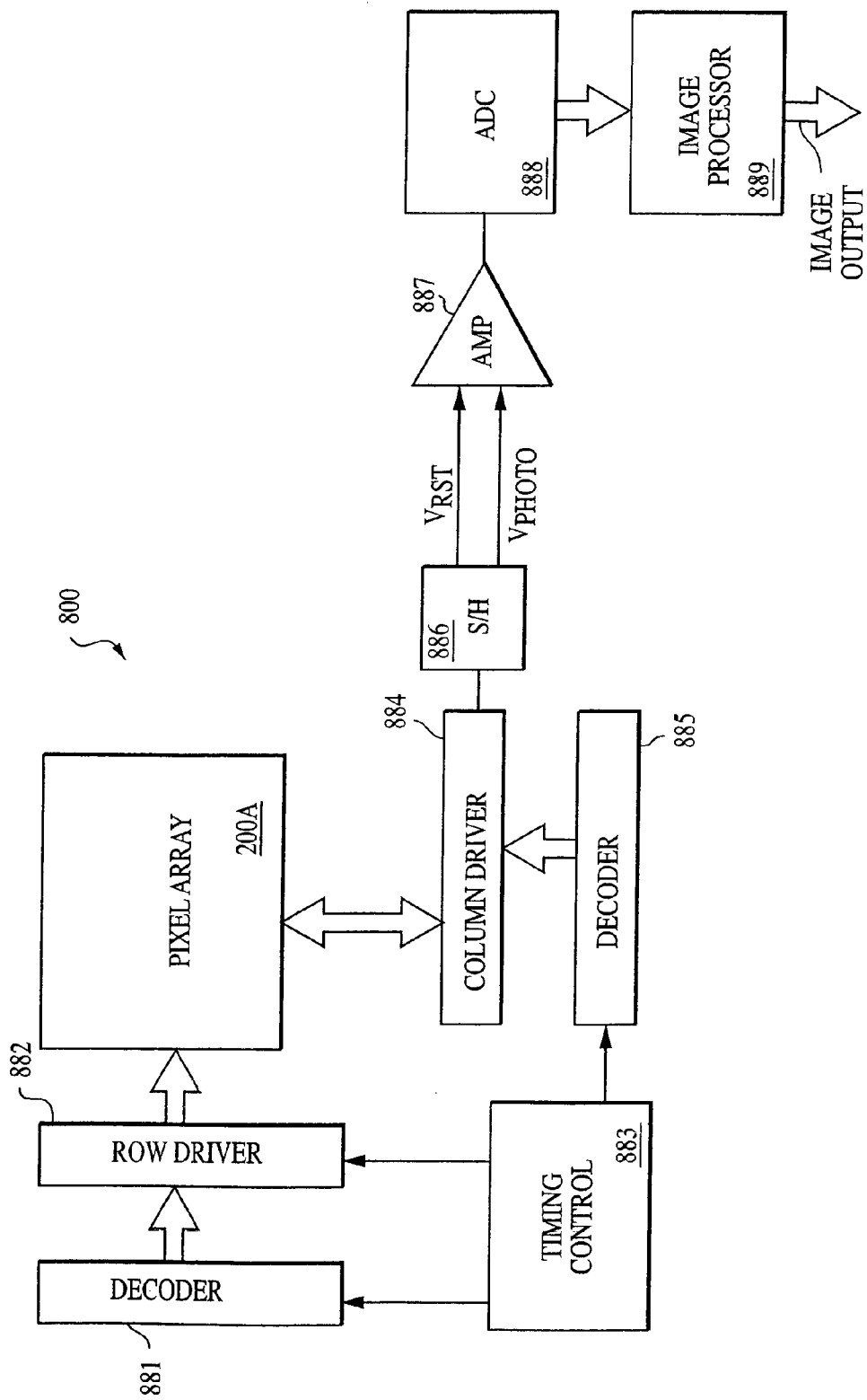
FIG. 8 is a block diagram of an image sensor according to another embodiment of the invention.

A typical single chip CMOS image sensor 800 is illustrated by the block diagram of FIG. 8. The image sensor 800 includes a pixel cell array 200A according to an embodiment of the invention. The pixel cells of array 200A are arranged in a predetermined number of columns and rows. Alternatively, the image sensor 800 can include other pixel cell arrays according to an embodiment of the invention, such as any of arrays 200B or 200D. As discussed above in connection with FIG. 6, an image sensor including the array 200C, preferably includes circuits 601, 602.

The rows of pixel cells in array 200A are read out one by one. Accordingly, pixel cells in a row of array 200A are all selected for readout at the same time by a row select line, and each pixel cell in a selected row provides a signal representative of received light to a readout line for its column. In the array 200A, each column also has a select line, and the pixel cells of each column are selectively read out in response to the column select lines.

The row lines in the array 200A are selectively activated by a row driver 882 in response to row address decoder 881. The column select lines are selectively activated by a column driver 884 in response to column address decoder 885. The array 200A is operated by the timing and control circuit 883, which controls address decoders 881, 885 for selecting the appropriate row and column lines for pixel signal readout.

The signals on the column readout lines typically include a pixel reset signal ($V_{rst}$) and a pixel image signal ($V_{sig}$) for each pixel cell. Both signals are read into a sample and hold circuit (S/H) 886 in response to the column driver 884. A differential signal ($V_{rst}$–$V_{sig}$) is produced by differential amplifier (AMP) 887 for each pixel cell, and each pixel cell's differential signal is amplified and digitized by analog-to-digital converter (ADC) 888. The analog-to-digital converter 888 supplies the digitized pixel signals to an image processor 889, which performs appropriate image processing before providing digital signals defining an image output.

Figure 9:
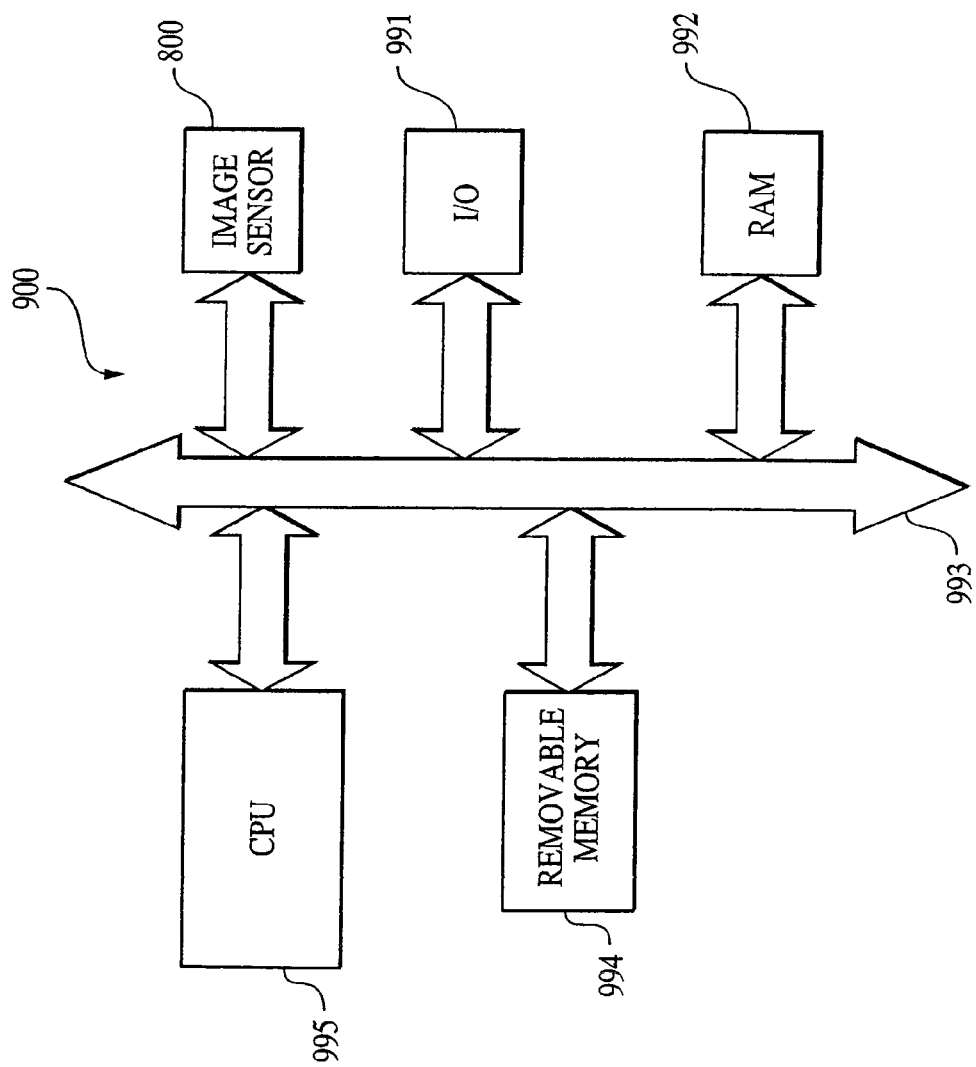
FIG. 9 is a block diagram of a processor system including the image sensor of FIG. 8.

FIG. 9 illustrates a processor-based system 900 including the image sensor 800 of FIG. 8. The processor-based system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 900, for example a camera system, generally comprises a central processing unit (CPU) 995, such as a microprocessor, that communicates with an input/output (I/O) device 991 over a bus 993. Image sensor 800 also communicates with the CPU 995 over bus 993. The processor-based system 900 also includes random access memory (RAM) 992, and can include removable memory 994, such as flash memory, which also communicate with CPU 995 over the bus 993. Image sensor 800 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

The invention claimed is:

1. An image sensor comprising:
    an array of pixel cells, each pixel cell comprising:
        a photo-conversion device;
        a micro-lens; and
        a color filter consisting of:
            a photonic crystal structure over the photo-conversion device and beneath the micro-lens, the photonic crystal structure being configured to permit light of predetermined wavelengths to reach the photo-conversion device.

2. The image sensor of claim 1, wherein the photonic crystal structure over a first photo-conversion device and the photonic crystal structure over a second photo-conversion respectively pass light waves of different wavelengths to to the first and second photo-conversion devices.

3. The image sensor of claim 1, wherein a photonic crystal structure over a first photo-conversion device is configured to pass green wavelengths of light, a a photonic crystal structure over a second photo-conversion device is configured to pass red wavelengths of light, and a photonic crystal structure over a third photo-conversion device is configured to pass blue wavelengths of light.

4. The image sensor of claim 3, wherein the first, second, and third photo-conversion devices and photonic crystal structures are arranged in a Bayer pattern.

5. The image sensor of claim 3, wherein the photonic crystal structures over a plurality of photo-conversion devices of the array are configured to pass infrared wavelengths of light.

6. The image sensor of claim 1, wherein a photonic crystal structure over a respective photo-conversion device is configured to pass infrared wavelengths of light.

7. The image sensor of claim 1, wherein the photonic crystal structure over respective photo-conversion devices are part of a photonic crystal structure layer provided over said array.

8. The image sensor of claim 1, wherein the photonic crystal structure includes a plurality of photonic crystal structure layers arranged one over another.

9. The image sensor of claim 8, further comprising a dielectric layer between the photonic crystal structure layers.

10. The image sensor of claim 1, wherein the photonic crystal structure includes a single photonic crystal structure layer.

11. The image sensor of claim 1, wherein the photonic crystal structure comprises a plurality of pillars spaced apart from each other.

12. The image sensor of claim 11, wherein the photonic crystal structure further comprises a material within the spacing between the pillars, the material having a dielectric constant that is lower than a dielectric constant of the pillars.

13. The image sensor of claim 11, wherein the pillars comprise aluminum oxide.

14. An image sensor comprising:
an array of photo-conversion devices;
an array of micro lenses respectively associated with the photo conversion devices; and
an array of color filters respectively over the photo-conversion devices and beneath the micro-lens, each color filter consisting of a photonic crystal structure for passing light of a predetermined wavelength to an associated photo conversion device.

15. The image sensor of claim 14, wherein each photonic crystal structure comprises a plurality of pillars spaced apart from each other and wherein each photonic crystal structure further comprises a material within the spacing between the pillars which has a dielectric constant that is different than a dielectric constant of the pillars.

16. The image sensor of claim 15, wherein the dielectric constant of the material within the spacing is lower than the dielectric constant of the pillars.

17. The image sensor of claim 14, wherein the photonic crystal structure has a plurality of photonic crystal structure layers.

18. A processor system comprising:
(i) a processor; and
(ii) an image sensor coupled to the processor, the image sensor comprising:
a substrate,
an array of pixel cells at a surface of the substrate, each pixel cell comprising:
a photo-conversion device;
a micro-lens; and
a color filter consisting of:
a photonic crystal structure over the photo-conversion device and beneath the micro-lens, the photonic crystal structure being configured to permit light of predetermined wavelengths to reach the photo-conversion device.

19. The processor system of claim 18, wherein the image sensor is a CMOS image sensor.

20. The processor system of claim 18, wherein the image sensor is a charge coupled device image sensor.

21. The image sensor of claim 18, wherein the photonic crystal structure has a plurality of photonic crystal structure layers.

* * * * *